United States Patent [19]

Nandakumar et al.

[11] Patent Number: 5,917,219
[45] Date of Patent: *Jun. 29, 1999

[54] SEMICONDUCTOR DEVICES WITH POCKET IMPLANT AND COUNTER DOPING

[75] Inventors: Mahalingam Nandakumar, Richardson; Amitava Chatterjee, Plano; Mark S. Rodder, Dallas; Ih-Chin Chen, Richardson, all of Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,599

[22] Filed: Oct. 3, 1996

Related U.S. Application Data

[60] Provisional application No. 60/005,216, Oct. 9, 1995.
[51] Int. Cl.⁶ .......................... H01L 27/01; H01L 27/12; H01L 31/0397
[52] U.S. Cl. .......................... 257/348; 257/327; 257/345
[58] Field of Search .......................... 257/348, 607–612, 257/327, 345, 401–404

[56] References Cited

U.S. PATENT DOCUMENTS

| | | | |
|---|---|---|---|
| 4,276,095 | 6/1981 | Beilstein, Jr. et al. . | |
| 4,649,629 | 3/1987 | Miller et al. .......................... | 257/402 |
| 4,869,781 | 9/1989 | Euen et al. .......................... | 257/403 |
| 5,198,687 | 3/1993 | Baliga .......................... | 257/402 |
| 5,362,981 | 11/1994 | Sato et al. .......................... | 257/402 |
| 5,401,994 | 3/1995 | Adan .......................... | 257/404 |
| 5,440,160 | 8/1995 | Vinal .......................... | 257/403 |
| 5,463,237 | 10/1995 | Funaki . | |
| 5,536,957 | 7/1996 | Okumura .......................... | 257/403 |
| 5,548,148 | 8/1996 | Bindal .......................... | 257/403 |
| 5,719,430 | 2/1998 | Goto . | |

OTHER PUBLICATIONS

M. Nandakumar, et al., "A Device Design Study of 0.25μm Gate Length CMOS for 1V Low Power Applications", pp. 1–2.

Lisa T. Su, et al., "Tradeoffs of Current Drive vs. Short–Channel Effect in Deep–Submicrometer Bulk and SOI MOSFETs", 1994 *IEEE*, pp. 27.2.1–27.2.4.

M. Rodder, et al., "Design Process Dependence of 0.25μm Gate Length CMOS for Imporved Performance and Reliability", 1994 *IEEE*, pp. 4.2.1–4.2.3.

Ghavam G. Shahidi, et al., "A Room Temperature 0.1 μm CMOS on SOI", 1994 *IEEE*, pp. 2405–2411.

D. Hisamoto, et al., High–Performance Sub 0.1–μm CMOS with Low–Resistance T–Shaped Gates Fabricated by Selective CVD–W, 1995 *Symposium on VLSI Technology Digest of Technical Papers*, pp. 115–116.

G.G. Shahidi, et al. "Indium Channel Implant for Improved Short–Channel Behavior of Submicrometer NMOSFET's", 1993 *IEEE*, vol. 14, No. 8 Aug. pp. 409–411.

(List continued on next page.)

*Primary Examiner*—Stephen D. Meier
*Attorney, Agent, or Firm*—Jacqueline J. Garner; Wade James Brady; Richard L. Donaldson

[57] ABSTRACT

A low power transistor (70, 70') formed in a face of a semiconductor layer (86) of a first conductivity type. The transistor includes a source and drain regions (76, 78) of a second conductivity type formed in the face of the semiconductor layer, and a gate (72) insulatively disposed adjacent the face of the semiconductor layer and between the source and drain regions. A layer of counter doping (80, 80') of the second conductivity type is formed adjacent to the face of the semiconductor layer generally between the source and drain regions. A first and second pockets (82, 84, 82', 84') of the first conductivity type may also be formed generally adjacent to the source and drain regions and the counter doped layer (80, 80').

9 Claims, 6 Drawing Sheets

OTHER PUBLICATIONS

D.M. Boulin, et al. "A Symmetric 0.25μm CMOS Technology for Low–Power, High–Performance ASCIC Applications Using 248nm DUV Lithography", 1995 *Symposium on VLSI Technology Digest of Technical Papers*, pp. 65–66.

Junji Koga, et al., "A Comprehensive Study of MOSFET Electron Mobility in Both Weak and Strong Inversion Regimes", *IEDM94*, pp. 18.6.1–18.6.4.

Y. Mii, et al., "An Ultra–Low Power 0.1 μm CMOS", 1994 *Symposium on VLSI Technology Digest of Technical Papers*, pp. 9–10.

Takeski Andoh, et al., "Design Methodology for Low–Voltage MOSFETs", 1994 *IEEE*, pp. 4.4.1–4.4.4.

M. Rodder, et al., "Oxide Thickness Dependence of Inverter Delay and Device Reliability for 0.25 μm CMOS Technology", *IEEE*, pp. 36.1.1–36.1.4.

5,917,219

SEMICONDUCTOR DEVICES WITH POCKET IMPLANT AND COUNTER DOPING

This application claims priority under 35 USC §119(e) (1) of provisional application Ser. No. 60/005,216, filed Oct. 9, 1995.

TECHNICAL FIELD OF THE INVENTION

This invention is related in general to the field of semiconductor devices. More particularly, the invention is related to semiconductor devices with pocket implant and counter doping.

BACKGROUND OF THE INVENTION

Portable personal electronic devices such as cellular telephones, notebook computers, and other peripheral equipment have become increasingly popular for consumers. The current technological challenge in building portable battery-operated equipment is to drastically reduce the power consumption and thus prolong battery life, and still maintain reasonable speed performance. The low standby power demands of CMOS makes it especially suited for this application. Although reducing the power supply voltage, $V_{DD}$, to 1 V or below is very effective in reducing power consumption, it also lowers the speed performance. To lower the supply voltage and still maintain operational speed, the threshold voltage of the transistor, $V_T$, must also be lowered. The threshold voltage can be reduced by using a lower substrate impurity concentration. However, this increases the undesirable short channel effect in submicron devices. Therefore, it may be seen that the design of a submicron transistor for low power supply voltage operations is non-trivial.

SUMMARY OF THE INVENTION

Accordingly, there is a need for a low power submicron transistor structure that provides low $V_T$, reduced short channel effect, and good speed performance.

In accordance with the present invention, a low threshold voltage transistor with improved performance is provided which eliminates or substantially reduces the disadvantages associated with prior transistor devices.

In one aspect of the invention, a transistor is formed in a face of a semiconductor. The transistor includes source and drain regions formed in the face of the semiconductor layer with a gate insulatively disposed adjacent the face of the semiconductor layer and between the source and drain regions. A layer of counter doping is introduced in and near the face of the semiconductor layer generally between the source and drain regions. Two pocket implants may also be formed generally adjacent to the source and/or drain regions and the counter doped layer.

In another aspect of the invention, a method of manufacturing a transistor is provided. The transistor is formed in a face of a semiconductor layer having a first conductivity type is provided. The method includes the steps of selectively implanting a shallow layer of impurities of a second conductivity type adjacent to the face of the semiconductor layer and forming pockets of impurities of the first conductivity type generally adjacent to the source and drain regions below the gate. The pockets may also be formed closer to the face of the semiconductor layer with the layer of counter doping therebetween.

In yet anther aspect of the invention, a transistor structure includes a surface counter doping layer of the second impurity type formed generally between the drain and source regions, and pocket implants of the first impurity type formed generally adjacent and/or below the counter doping layer.

Technical advantages of the instant invention include a submission transistor structure that has low threshold voltage satisfying the need for high performance at lower power supply voltages for portable electronic equipment. The instant transistor structure(s) satisfies this need with a reduced short channel effect which in turn minimizes the sensitivity of transistor performance to gate length variation at shorter channel lengths.

BRIEF DESCRIPTION OF THE DRAWINGS

For a better understanding of the present invention, reference may be made to the accompanying drawings, in which.

DETAILED DESCRIPTION OF THE INVENTION

Figure 1A:
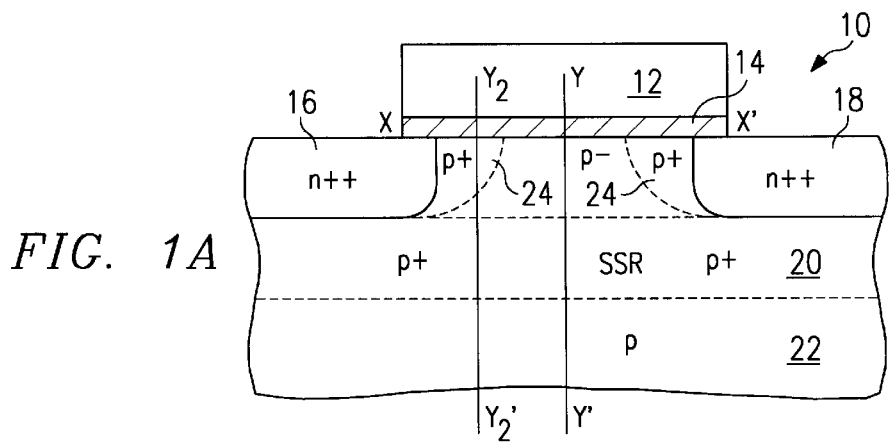
FIG. 1A is a cross-sectional view of a transistor structure with super-steep retrograde channel and pocket implant.

The preferred embodiment(s) of the present invention is (are) illustrated in FIGS. 1–6, like reference numerals being used to refer to like and corresponding parts of the various drawings.

In FIG. 1A, an nMOS transistor structure 10 includes a gate electrode 12, gate dielectric 14, and source and drain $n^{++}$ regions 16 and 18. A $p^+$ super-steep retrograde (SSR) channel 20 is further formed at a predetermined distance or depth from the top surface of the device in a p-type substrate or well structure 22. For example, 190 Kev indium (In) at a dose of $1 \times 10^{13}$ cm$^{-2}$ may be implanted in an nMOS to form the super-steep retrograde channel 20. In a pMOS device with $p^{++}$ source and drain regions (not shown), the $n^+$ super-steep retrograde channel may be formed by implanting arsenic (As). When compared with conventional channel doping profiles using boron (B) for nMOS and Phosphorus (P) for pMOS, for example, super-steep retrograde channel profile has been shown to provide better short channel integrity. Further, super-steep retrograde channel doping also provides a higher channel mobility due to lower surface doping.

Figure 1B:
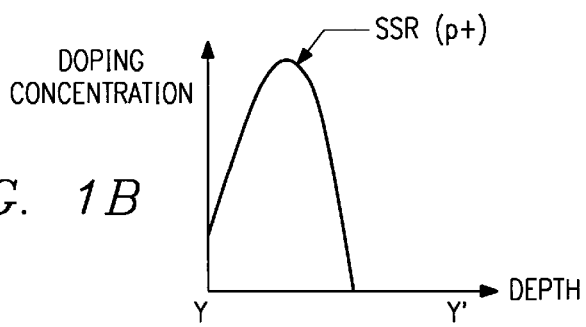
FIG. 1B is an exemplary plot of doping concentration versus depth of the transistor structure along Y–Y' as shown in FIG. 1A.
Figure 1C:
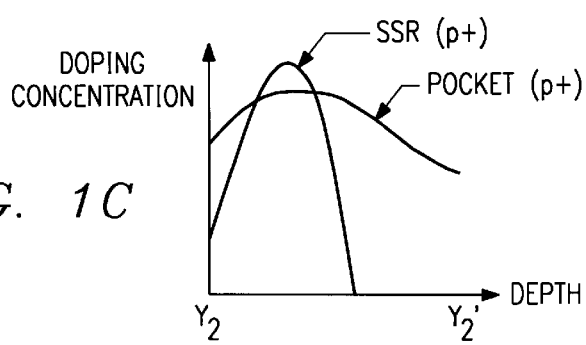
FIG. 1C is an exemplary plot of doping concentration versus depth along $Y_2$–$Y_2$' in the transistor structure shown in FIG. 1A.
Figure 1D:
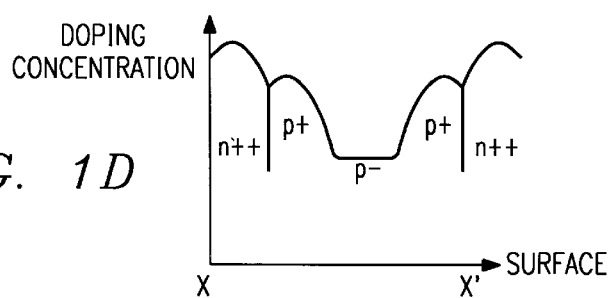
FIG. 1D is an exemplary plot of doping concentration along the surface X–X' of the transistor structure shown in FIG. 1A.

In addition to the super-steep retrograde channel profile 20, shallow pocket implants or halos 24 of an opposite type to the source and drain regions 16 and 18 are formed. The pocket implants 24 are generally adjacent and/or below the source and drain regions 16 and 18. For an nMOS device, boron may be used as a typical dopant species for the pocket implant; for a pMOS device, phosphorous may be used to form the pocket implant. Exemplary implant doses of $5 \times 10^{12}$ to $2 \times 10^{13}$ cm$^{-2}$ may be used to form the pocket implants. FIG. 1B is an exemplary plot of doping concentration versus depth for transistor structure 10 along Y–Y', and FIG. 1C is an exemplary plot of doping concentration along $Y_2$–$Y_2'$. In addition, FIG. 1D is an exemplary plot of surface doping concentration along X–X'.

Transistor structure 10 with both super-steep retrograde channel doping 20 and pocket implants 24 has reduced short-channel effect when compared to a super-steep retrograde only channel profile, described in technical articles such as "Indium Channel Implant for Improved Short-Channel Behavior of Submicrometer nMOSFET's" by Shahidi et al. in *IEEE Electron Device Letters,* Vol. 14, No. 8, p. 409, August 1993; and "Tradeoffs of Current Drive vs. Short-Channel Effect in Deep-Submicrometer Bulk and SOI MOSFETs" by Su et al. in *IEEE IEDM,* p. 649, 1994. The pocket implantation process is discussed in "Design/Process Dependence of 0.25 μm Gate Length CMOS for Improved Performance and Reliability" by Rodder et al. in *IEEE IEDM,* p. 71, 1994. Transistor structure 10 also has better short channel integrity when compared to a conventional device with pocket implants described in Rodder et al.

Figure 2A:
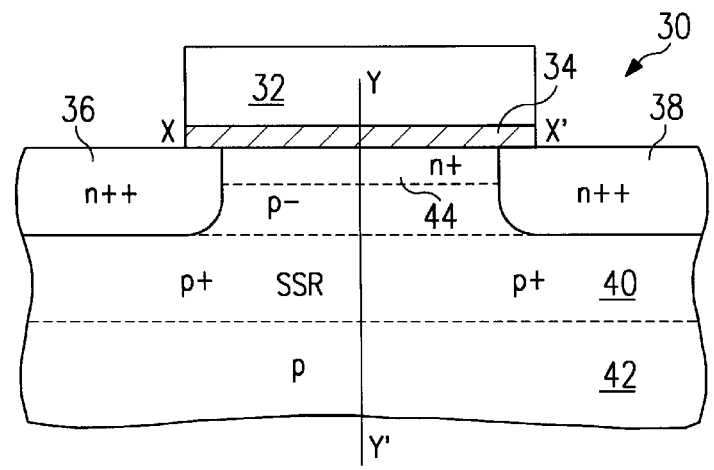
FIG. 2A is a cross-sectional view of a transistor structure with super-steep retrograde channel and counter doping.
Figure 2B:
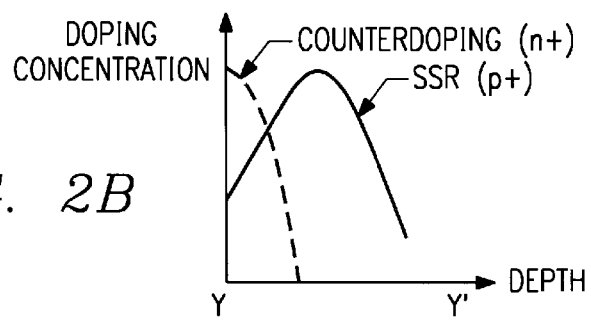
FIG. 2B is an exemplary plot of doping concentration versus depth of a transistor structure with super-steep retrograde channel and counter doping along Y–Y' as shown in FIG. 2A.
Figure 2C:
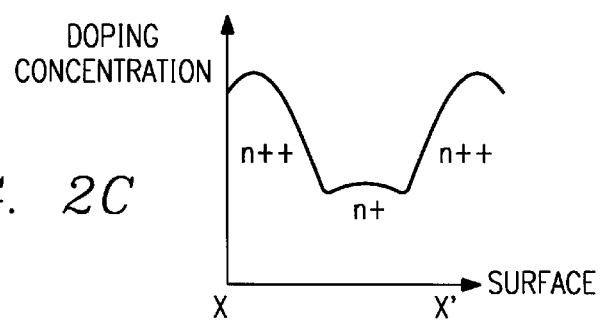
FIG. 2C is an exemplary plot of doping concentration along the surface X–X' of the transistor structure shown in FIG. 2A.

Referring to FIG. 2A, a transistor structure 30 with super-steep retrograde channel profile and shallow surface counter doping is shown. Transistor structure 30 is shown as an nMOS with a gate electrode 32, gate dielectric 34, and source and drain $n^{++}$ regions 36 and 38. A p-type super-steep retrograde buried channel 40 is formed at a predetermined depth in a p-type substrate or well formation 42. A narrow layer 44 of surface counter doping of n-type ($n^+$) is formed in the region between source and drain regions 36 and 38 and below gate 32. The counter doping may be formed with, for example, arsenic (As) at a dosage of 2 to $4 \times 10^{12}$ cm$^{-2}$ for nMOS or $BF_2$ for pMOS (not shown). FIG. 2B is an exemplary plot of doping concentration versus depth of transistor structure 30 taken along Y–Y', and FIG. 2C is an exemplary plot of surface doping concentration along X–X'. Counter doping is discussed in articles such as "High Performance Sub-0.1-μm CMOS with Low-Resistance T-shaped Gates Fabricated by Selective CVD-W" by Hisamoto et al. in *Symposium on VLSI Technology Digest of Technical Papers,* 1995; and "A Device Design Study of 0.25 μm Gate Length CMOS for IV Low Power Applications" by Nandakumar et al. submitted for publication in the *IEEE Symposium on Low Power Electronics,* October 1995.

Transistor structure 30 combining super-steep retrograde channel 40 and surface counter doping 44 lowers the threshold voltage and maintains good short channel effect. The counter doping 44 provides threshold voltage scaling to the desired range of approximately 0.05 to 0.15 volts, while the underlying super-steep retrograde channel profile 40 is more effective at reducing threshold voltage roll-off than conventional well and channel profile described in Hisamoto et al. Transistor structure 30 also maintains high nominal drive current due to its low threshold voltage and high effective electron mobility $\mu_{eff}$. Therefore, the combination of these features provides optimal performance for low supply voltage CMOS applications.

Figure 3A:
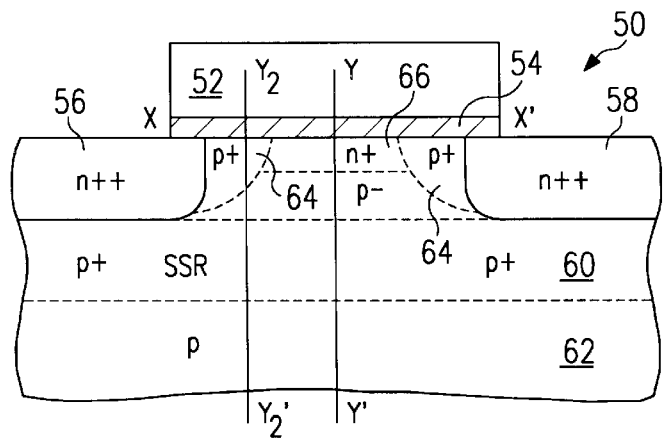
FIG. 3A is a cross-sectional view of a transistor structure with super-steep retrograde channel, pocket implant, and counter doping.
Figure 3B:
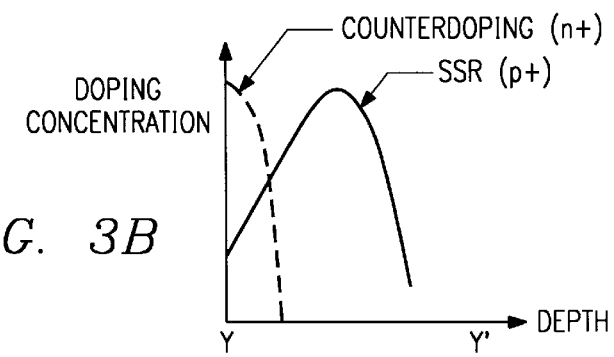
FIG. 3B is an exemplary plot of doping concentration versus depth of the transistor structure along Y–Y' as shown in FIG. 3A.
Figure 3C:
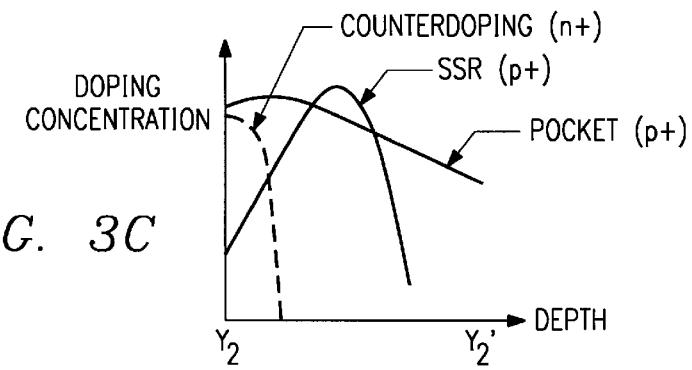
FIG. 3C is an exemplary plot of doping concentration versus depth along $Y_2$–$Y_2$' in the transistor structure shown in FIG. 3A.
Figure 3D:
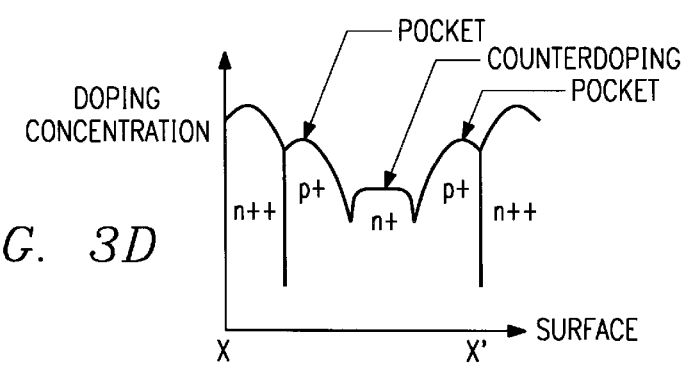
FIG. 3D is an exemplary plot of doping concentration along the surface X–X' of the transistor structure shown in FIG. 3A.

Referring to FIG. 3A, a transistor structure 50 with a super-steep retrograde channel profile, pocket implantation, and counter doping is shown. Transistor structure 50 is shown as an nMOS and includes a gate electrode 52, gate dielectric 54, and source and drain regions 56 and 58. A super-steep retrograde channel 60 is implanted subsurface generally below source and drain regions 56 and 58 in a substrate or well structure 62. Pockets 64 are implanted at a shallow depth near the surface and adjacent to source and drain regions 56 and 58. Surface counter doping 66 is also formed generally between implanted pockets 64. An exemplary doping concentration versus depth plot for transistor 50 along Y–Y' is shown in FIG. 3B, and another exemplary plot of doping concentration along $Y_2$–$Y_2'$ is shown in FIG. 3C. A surface doping concentration plot along X–X' of transistor structure 50 is shown in FIG. 3D.

Figure 4A:
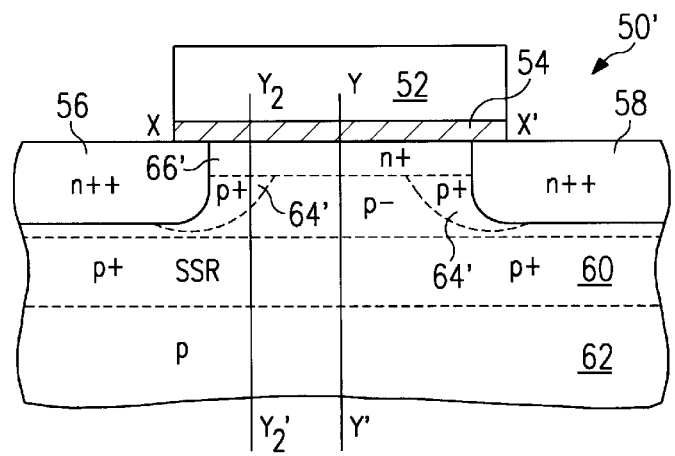
FIG. 4A is a cross-sectional view of another transistor structure with super-steep retrograde channel, pocket implant, and counter doping.
Figure 4B:
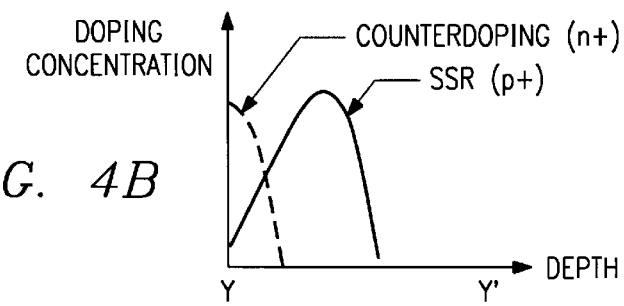
FIG. 4B is an exemplary plot of doping concentration versus depth of the transistor structure along Y–Y' as shown in FIG. 4A.
Figure 4C:
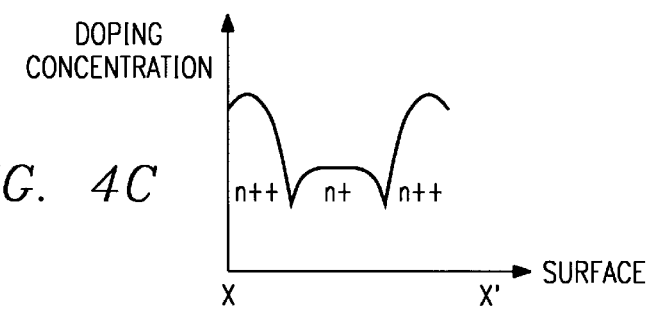
FIG. 4C is an exemplary plot of doping concentration along the surface X—X' of the transistor structure shown in FIG. 4A.
Figure 4D:
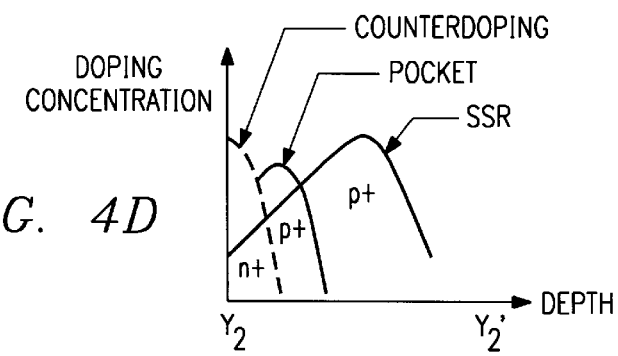
FIG. 4D is an exemplary plot of doping concentration versus depth along $Y_2$–$Y_2$' of the transistor structure shown in FIG. 4A.

FIG. 4A shows one possible variation of the placement of pocket implants with respect to counter doping. Transistor 50' includes pocket implants 64' that are slightly subsurface below the counter doped layer 66'. An exemplary doping concentration versus depth plot along Y–Y' for transistor 50' is shown in FIG. 4B, surface doping concentration along X–X' is shown in FIG. 4C, and doping concentration along $Y_2$–$Y_2'$ is shown in FIG. 4D.

Transistor structures 50 and 50' combines the advantages of super-steep retrograde channel, pocket implants, and surface counter doping and are both well-suited to low power applications due to their low threshold voltage, reduced short channel effect, and good drive current.

Figure 5A:
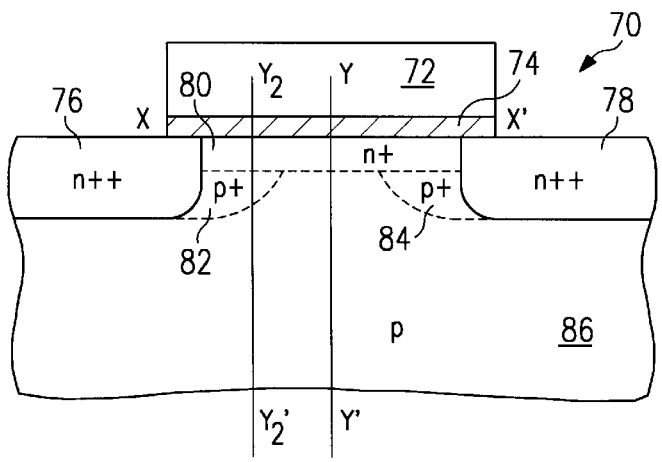
FIG. 5A is a cross-sectional view of a transistor structure with pocket implant and counter doping.
Figure 5B:
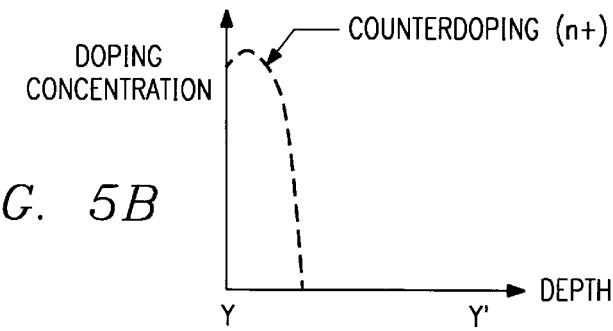
FIG. 5B is an exemplary plot of doping concentration versus depth of a transistor structure along Y–Y' as shown in FIG. 5A.
Figure 5C:
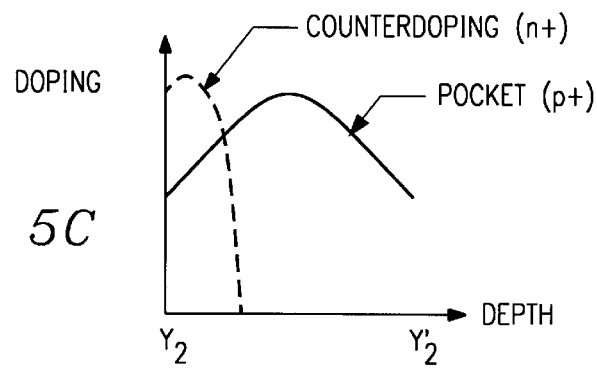
FIG. 5C is an exemplary plot of doping concentration versus depth along $Y_2$–$Y_2'$ of the transistor structure shown in FIG. 5A.
Figure 5D:
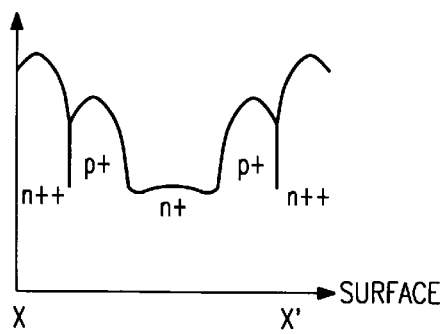
FIG. 5D is an exemplary plot of doping concentration along the surface X–X' of the transistor structure shown in FIG. 5A.

FIG. 5A is a cross-sectional view of a transistor structure 70 that does not incorporate a super-steep retrograde channel profile and yet still has low threshold voltage and improved short channel effect. Transistor structure 70 includes a gate electrode 72, gate dielectric 74, and source and drain $n^{++}$ regions 76 and 78. Transistor structure 70 further includes a surface counter doping $n^+$ layer 80 in combination with pocket implants 82 and 84 of an opposite type ($p^+$). As discussed above, the placement of surface counter doping layer 80 and pocket implants 82 and 84 may have a number of variations, all of which are contemplated herein. Exemplary doping concentration in transistor 70 along lines Y–Y' and $Y_2$–$Y_2$' are shown in FIGS. 5B and 5C, respectively. An exemplary surface doping concentration of transistor structure 70 along X–X' is shown in FIG. 5D.

Figure 6A:
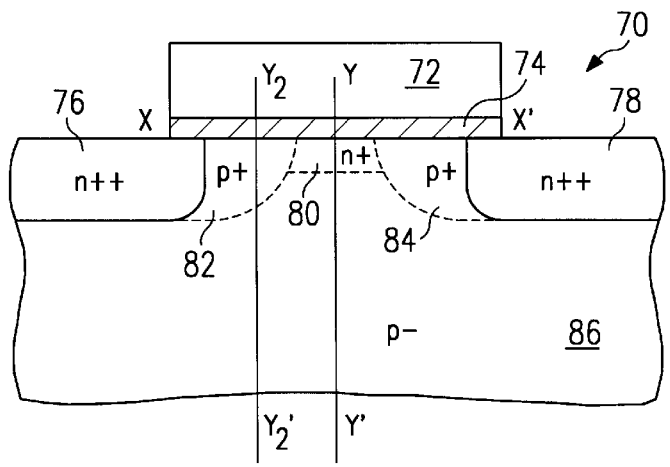
FIG. 6A is a cross-sectional view of another transistor structure with pocket implant and counter doping.
Figure 6B:
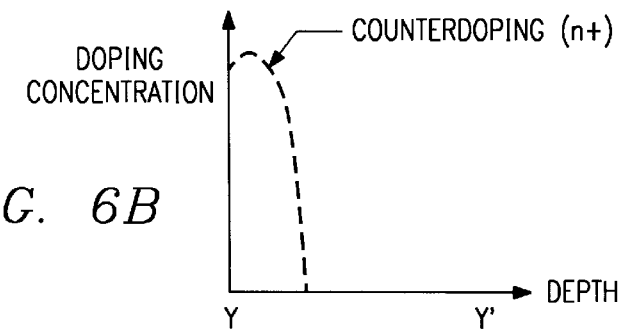
FIG. 6B is an exemplary plot of doping concentration versus depth of a transistor structure along Y–Y' as shown in FIG. 6A.
Figure 6C:
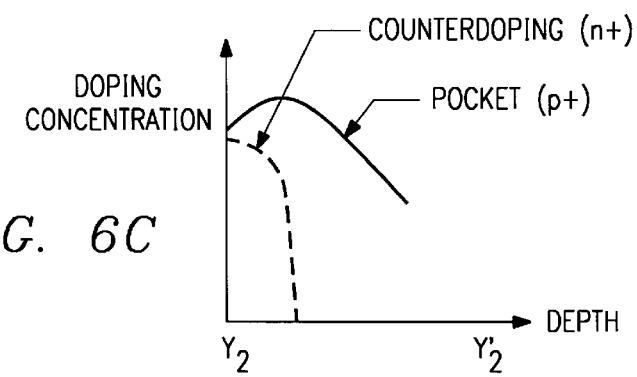
FIG. 6C is an exemplary plot of doping concentration versus depth along $Y_2$–$Y_2'$ of the transistor structure shown in FIG. 6A.
Figure 6D:
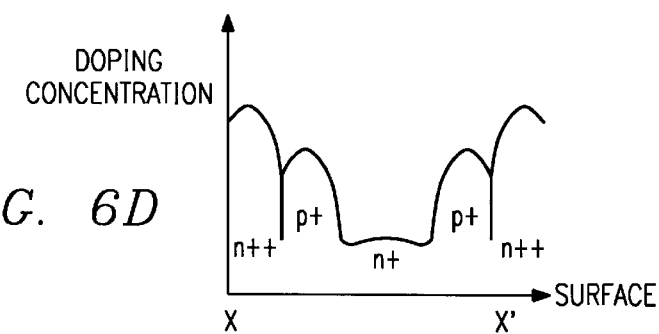
FIG. 6D is an exemplary plot of doping concentration along the surface X–X' of the transistor structure shown in FIG. 6A.

FIG. 6A is a cross-sectional view of yet another transistor structure 70' with counter doping and pocket implants. Transistor structure 70' includes a gate electrode 72, gate dielectric 74, and source and drain $n^{++}$ regions 76 and 78. Transistor structure 70' further includes a surface counter doping $n^+$ layer 80' in combination with pocket implants 82' and 84' of an opposite type ($p^+$). As discussed above, the placement of surface counter doping layer 80' and pocket implants 82' and 84' may have a number of variations, all of which are contemplated herein. The pocket implants 82 and 84 of FIG. 5A are formed generally below the counter doping layer 80, but the pocket implants 82' and 84' are formed near the surface. Exemplary doping concentration in transistor 70' along lines Y–Y' and $Y_2$–$Y_2$' are shown in FIGS. 6B and 6C, respectively. An exemplary surface doping concentration of transistor structure 70 along X–X' is shown in FIG. 6D.

Transistors 10, 30, 50, 50', 70, and 70' may be constructed by conventional semiconductor processing technology and may include forming the super-steep retrograde channel, the gate, and drain and source regions. The counter doping may be formed before the formation of the gate. Pocket implant may be formed after gate formation.

The transistor structures, as constructed according to the teachings of the invention, are applicable to both nMOS and pMOS in CMOS technology. Although the present invention and its advantages have been described in detail, it should be understood that various changes, substitutions and alterations can be made therein without departing from the spirit and scope of the invention as defined by the appended claims. More specifically, it is important to note that the chemical compositions, concentrations and other detailed specifications enumerated above serve as illustrative examples and may be substituted by other such specifications as known in the art of semiconductor processing.

What is claimed is:

1. A transistor located at a surface of a semiconductor layer of a first conductivity type comprising:
   a source region of a second conductivity type located in said semiconductor layer;
   a drain region of said second conductivity type located in said semiconductor layer at a predetermined distance from said source region;
   a gate insulatively disposed adjacent said surface of said semiconductor layer and between said source and drain regions;
   a layer of counter doping of said second conductivity type located in and adjacent to said surface of said semiconductor layer between said source and drain regions;
   a first pocket of said first conductivity type located below said layer of counterdoping and adjacent to said source region but not adjacent said drain region; and
   a second pocket of said first conductivity type located below said layer of counterdoping and adjacent to said drain region but not adjacent said source region, wherein said first and second pockets extend into said semiconductor layer to a less than or equal extent than said source and drain regions.

2. The transistor, as set forth in claim 1, wherein said first and second pockets are located in and adjacent said surface of said semiconductor layer and said layer of counter doping is located between said first and second pockets of said first conductivity type.

3. The transistor, as set forth in claim 1, wherein said layer of counter doping extends from said source region to said drain region and said first and second pockets are located below said layer of counter doping.

4. A transistor located at a surface of a semiconductor layer of a first conductivity type comprising:
   a super steep retrograde channel layer of said first conductivity type located below a surface of said semiconductor layer;
   a source region of a second conductivity type located in said semiconductor layer;
   a drain region of said second conductivity type located in said semiconductor layer at a predetermined distance from said source region;
   a gate insulatively disposed adjacent said surface of said semiconductor layer and between said source and drain regions;
   a first and second pockets of said first conductivity located adjacent to said source and drain regions, respectively, and below said gate; and
   a layer of counter doping of said second conductivity type located adjacent to said surface of said semiconductor layer between said source and drain regions.

5. The transistor, as set forth in claim 4, wherein said first and second pockets of said first conductivity type are located adjacent to and below said source and drain regions.

6. The transistor, as set forth in claim 4, wherein said first and second pockets of said first conductivity type are located between said layer of counter doping said source and drain region, respectively and said layer of counter doping is located between said first and second pockets.

7. The transistor, as set forth in claim 4, wherein said layer of counter doping extends from said source region to said drain region and said first and second pockets are located below said layer of counter doping and not below said source and drain regions.

8. A transistor located at a surface of a semiconductor layer of a first conductivity type comprising:
   a super steep retrograde channel layer of said first conductivity type located below a surface of said semiconductor layer;
   a source region of a second conductivity type located in said semiconductor layer;
   a drain region of said second conductivity type located in said semiconductor layer at a predetermined distance from said source region;
   a gate insulatively disposed adjacent said surface of said semiconductor layer and between said source and drain regions; and
   a layer of counter doping of said second conductivity type located in and adjacent to said surface of said semiconductor layer between said source and drain regions.

9. A transistor located at a surface of a semiconductor layer of a first conductivity type comprising:
- a super steep retrograde channel layer of said first conductivity type located below a surface of said semiconductor layer;
- a source region of a second conductivity type located in said semiconductor layer;
- a drain region of said second conductivity type located in said semiconductor layer at a predetermined distance from said source region;
- a gate insulatively disposed adjacent said surface of said semiconductor layer and between said source and drain regions; and
- a first and second pockets of said first conductivity type located below said gate and adjacent to said source and drain regions, respectively, wherein said first and second pockets do not extend into said semiconductor layer below said source and drain regions.

* * * * *